(12) United States Patent
Chang et al.

(10) Patent No.: US 8,876,309 B2
(45) Date of Patent: Nov. 4, 2014

(54) ADJUSTABLE BACK-LIGHTING STRUCTURE FOR A KEYBOARD

(71) Applicants: Jih-Chuan Chang, Taipei (TW); Yu-Chun Tsai, Taipei (TW)

(72) Inventors: Jih-Chuan Chang, Taipei (TW); Yu-Chun Tsai, Taipei (TW); Chien-Chih Wang, Taipei (TW)

( * ) Notice: Subject to any disclaimer, the term of this patent is extended or adjusted under 35 U.S.C. 154(b) by 0 days.

(21) Appl. No.: 13/860,483

(22) Filed: Apr. 10, 2013

(65) Prior Publication Data

US 2013/0271948 A1 Oct. 17, 2013

(30) Foreign Application Priority Data

Apr. 12, 2012 (TW) .............................. 101206631 U

(51) Int. Cl.
*F21V 8/00* (2006.01)

(52) U.S. Cl.
CPC .................................... G02B 6/0011 (2013.01)
USPC ........................ 362/23.03; 362/97.1; 362/602

(58) Field of Classification Search
CPC ...................................................... G02B 6/0011
USPC ..................................... 362/23.07, 23.03, 602
See application file for complete search history.

(56) References Cited

U.S. PATENT DOCUMENTS

| | | | |
|---|---|---|---|
| 7,530,768 B2 * | 5/2009 | Durr et al. ...................... | 406/151 |
| 8,334,794 B2 * | 12/2012 | Watanabe et al. ................ | 341/22 |
| 8,378,857 B2 * | 2/2013 | Pance .............................. | 341/28 |
| 2005/0083672 A1 * | 4/2005 | Shipman et al. ................. | 362/26 |
| 2013/0265799 A1 * | 10/2013 | Chuang et al. ................. | 362/602 |
| 2013/0278448 A1 * | 10/2013 | Chen .............................. | 341/22 |

* cited by examiner

*Primary Examiner* — Anabel Ton

(57) ABSTRACT

An adjustable back-lighting structure for a keyboard includes a light guide panel having vertical peripheral edges and at least one light entering surface; and a surrounding edge made of plastic or chemical macromolecule compound material, having a connecting interface tightly bonded with the vertical peripheral edges of the light guide panel. The connecting interface can generates the feedback beam $B_f$ to enhance the illumination effect. Therefore, the light transmission in the light guide panel can be limited in the upper and lower surfaces without leakage at the vertical peripheral edges.

6 Claims, 5 Drawing Sheets

ADJUSTABLE BACK-LIGHTING STRUCTURE FOR A KEYBOARD

BACKGROUND OF THE INVENTION

1. Field of the Invention

The present invention relates to an adjustable back-lighting structure for a keyboard, and in particular to a structure adjusting surrounding light.

2. Description of Prior Art

To generate even flat light beams, typical back-lighting modules have light guide panel and light entering area on vertical peripheral edges of the light guide panel. When illuminating elements project light into the light entering area, light bounces between an upper and lower faces of the light guide panel, and then projects from the projecting surface. However, typical back-lighting modules trend to leak light from side edges, as shown in FIG. 1, the light guide panel 1 made of plasticized material has a projecting surface 12 and a first reflecting surface 13 as the upper and lower faces, which have some refracting capability. When the light B0 enters into the light entering surface 11, partial of the light B0 refract from the projecting surface 12 and the first reflecting surface 13, and partial of the light B0 forms a reflecting beam Br. The reflecting beam Br moves forward with a small incident angle and reaches the vertical peripheral edges 14 with a small refracting angle such that the reflecting beam Br tends to refract away from the vertical peripheral edges 14. A conventional method is to place a the seal strip 15 around the vertical peripheral edges 14 to prevent the reflecting beam Br from leaking, or to provide a second reflecting surface 150 on the seal strip 15 corresponding to the surface of the vertical peripheral edges 14, to reflect the reflecting beam Br back into the light guide panel 1. However, to form the typical light guide panel 1, the surface of the vertical peripheral edges 14 is not very even, after the seal strip 15 being placed onto the vertical peripheral edges 14, a gap 140 is formed between the vertical peripheral edges 14 and the seal strip 15 which leaks the refracting beam as beam B.

Another conventional method is to apply a layer of opaque ink at four surrounding edges of the light guide panel. However, the opaque ink layer cannot block the light completely and cannot fill up the gap.

SUMMARY OF THE INVENTION

The present invention has been accomplished under the circumstances in view. It is the main object of the present invention to provide an adjustable back-lighting structure for a keyboard, the structure has a light guide panel having vertical peripheral edges and at least one light entering surface and a surrounding edge made of plastic or chemical macromolecule compound material, having a connecting interface tightly bonded with the vertical peripheral edges of the light guide panel.

DETAILED DESCRIPTION OF THE INVENTION

Figure 1:
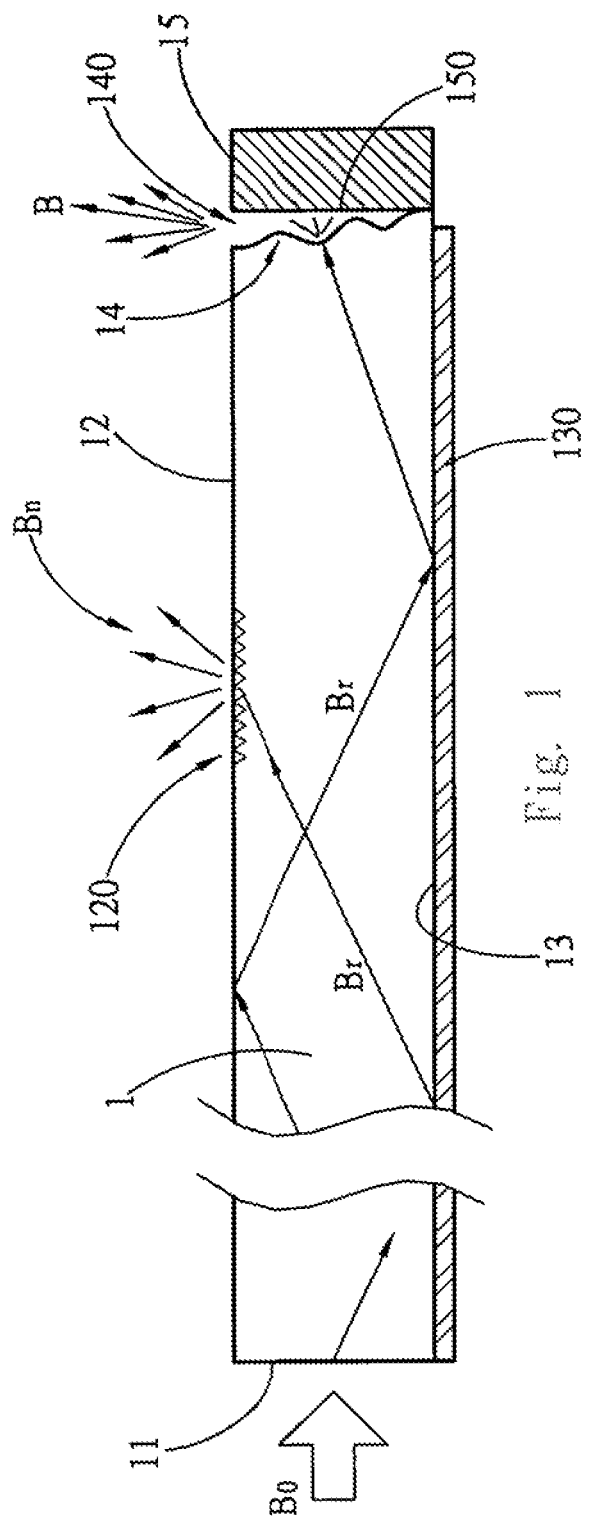
FIG. 1 is a schematic drawing of a prior art light guide panel leaking light.
Figure 2:
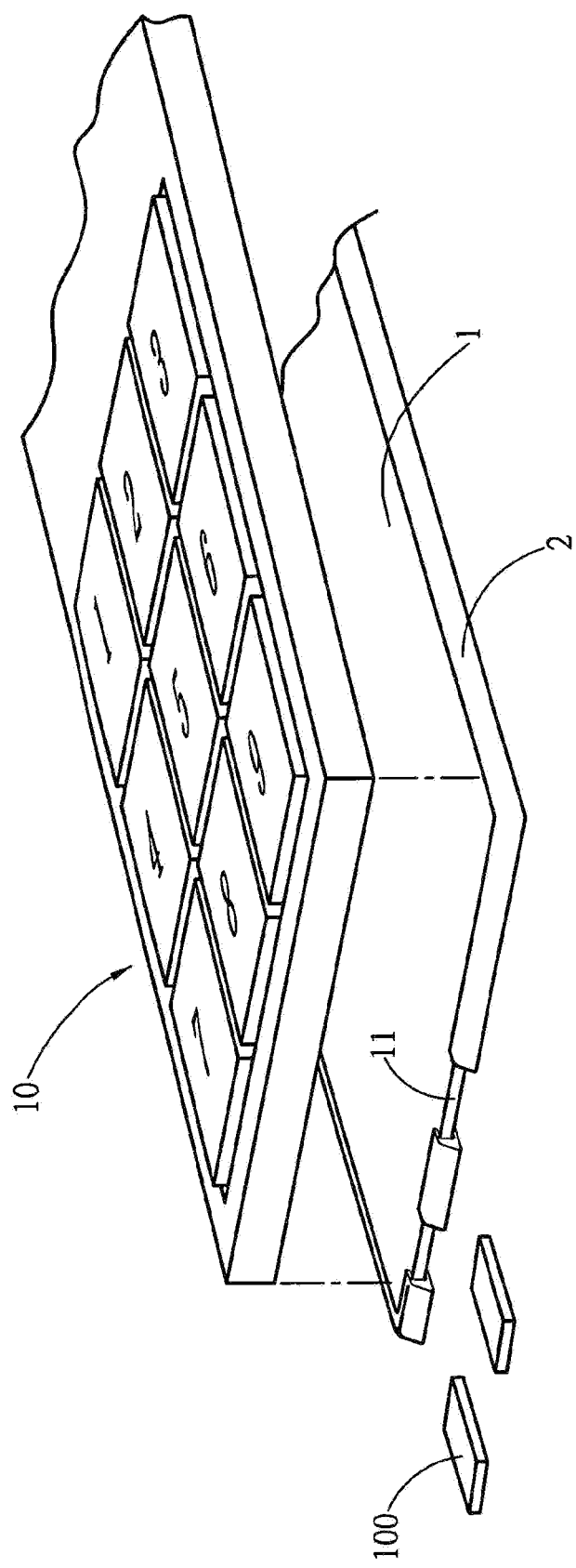
FIG. 2 is a schematic drawing of an adjustable back-lighting structure for a keyboard according to the present invention.

Please refer to FIG. 2. A light guide panel 1 is used for providing back-lighting to a keyboard 10. The light guide panel 1 is placed under the keyboard 10, and the light guide panel 1 is provided with a light entering surface 11. The light entering surface 11 allows a light beam form an illuminating element 100 to enter; alternatively, the light entering surface is formed by placing the illuminating element 100 in the light guide panel 1 adjacent to an edge. A surrounding edge 2 is from on the vertical peripheral edges 14 of the light guide panel 1, which is used for limiting or feeding back inner beams in the light guide panel 1.

The surrounding edge 2 is combined onto an outer surface of the vertical peripheral edges 14 to block the light beam to avoid light leakage from the light guide panel 1. The surrounding edge 2 is made of plastic or chemical macromolecule compound material and has a predetermined thickness (t), which might be macromolecule compound liquid adhered onto the vertical peripheral edges 14 or molded into apparatus on the vertical peripheral edges 14, such that a connecting interface 20 is formed between the surrounding edge 2 and the vertical peripheral edges 14. The surrounding edge 2 is formed by an adhering method such as a spraying, printing or insert moulding process or a soaking method to combine macromolecule material. The surrounding edge 2 is directly combined onto the vertical peripheral edges 14, therefore, the connecting interface 20 has no gap and provides strong combination strength. Due to the strong combination of the surrounding edge 2, the connecting interface 20 has no diffusing effect and has reflective capability. The surrounding edge 2 forms a solid thickness towards to an outer edge of the vertical peripheral edges 14, the thickness (t) is at least 0.2 mm which can be adjust by a cutting process.

The surrounding edge 2 is made of a shading material or a reflective material. When the surrounding edge 2 is a reflective material, the connecting interface 20 has stronger reflective capability to form a refracted reflecting beam Br as a feedback beam $B_f$. The feedback beam $B_f$ re-projects into the light guide panel 1 and, the reflective beam Br generates compensation, such that the light beam $B_0$ is enhanced, which can reduce the consuming power of the light guide panel 1.

The combination between the surrounding edge 2 and the vertical peripheral edges 14 can be formed by liquid soaking or thermoplastic process such as coating or printing processes to combine the surrounding edge 2 onto the vertical peripheral edges 14, or inserting the vertical peripheral edges 14 into a mould cavity to form the surrounding edge 2 on the vertical peripheral edges 14 by the inject molding process. With the coating or printing processes, when the light guide panel 1 is cut, four sides of the vertical peripheral edges 14 is form with smaller dimensions, then after the surrounding edge 2 formed on the vertical peripheral edges 14 by the coating or printing processes, the surrounding edge 2 on the light guide panel 1 is cut to make the vertical peripheral edges 14 with the predetermined dimensions.

Figure 5:
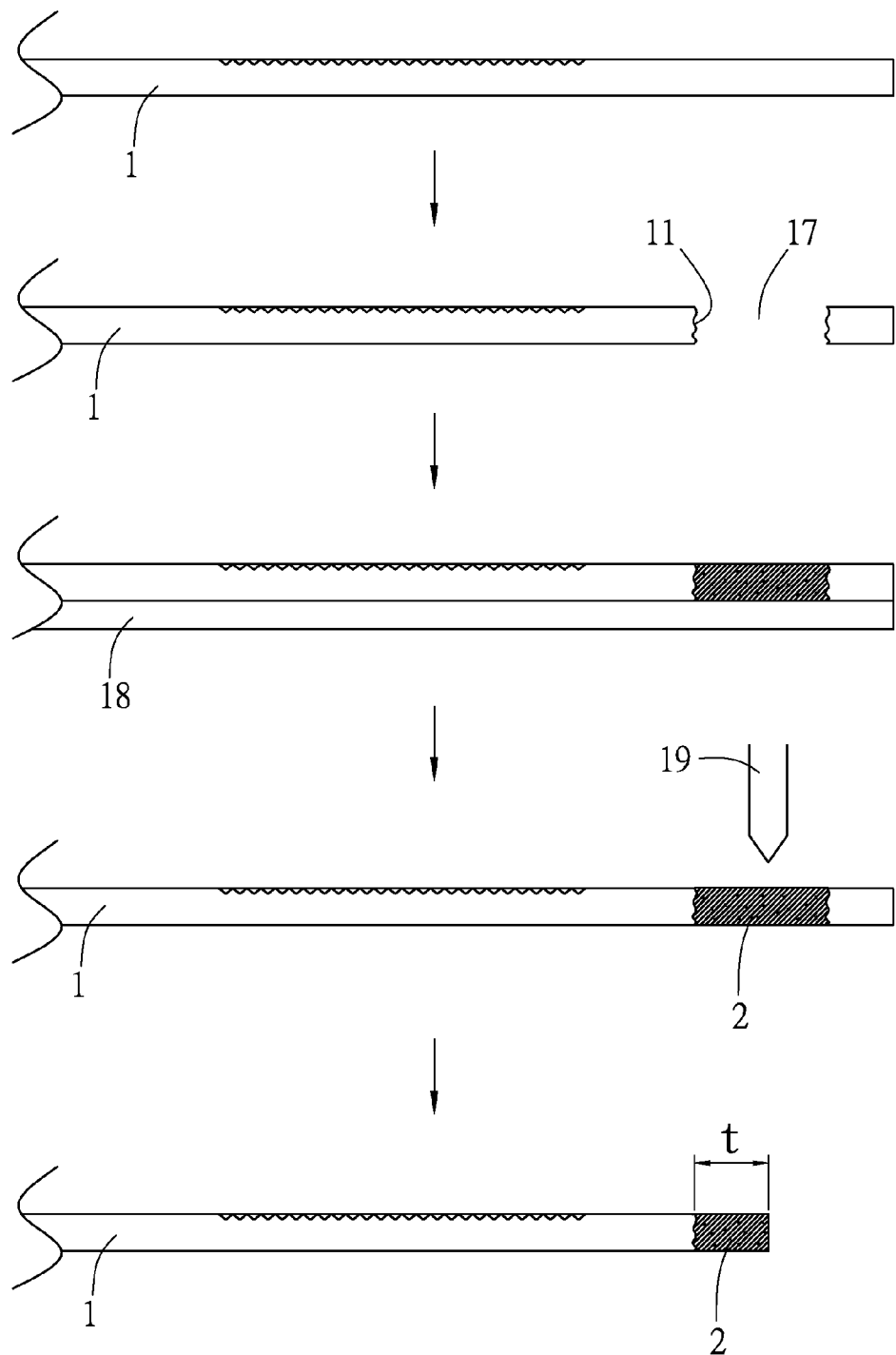
FIG. 5 is a cross-sectional processing drawing of the surrounding edge according to the present invention.

Accordingly, the formation of the surrounding edge, as shown in FIG. 5, a groove 17 is formed on the vertical peripheral edges 11 of the light guide panel 1, a carrying board 18 is disposed under the light guide panel 1 and the groove 17, the plastic or chemical macromolecule compound material is pulled into the groove 17, and the harden macromolecule compound material forms the surrounding edge 2 with the thickness (t). To adjust the thickness (t) or shape of the surrounding edge, a tool 19 is used for cutting process. Since the surrounding edge 2 has a predetermined thickness (t), it can prevent light leakage.

Figure 3:
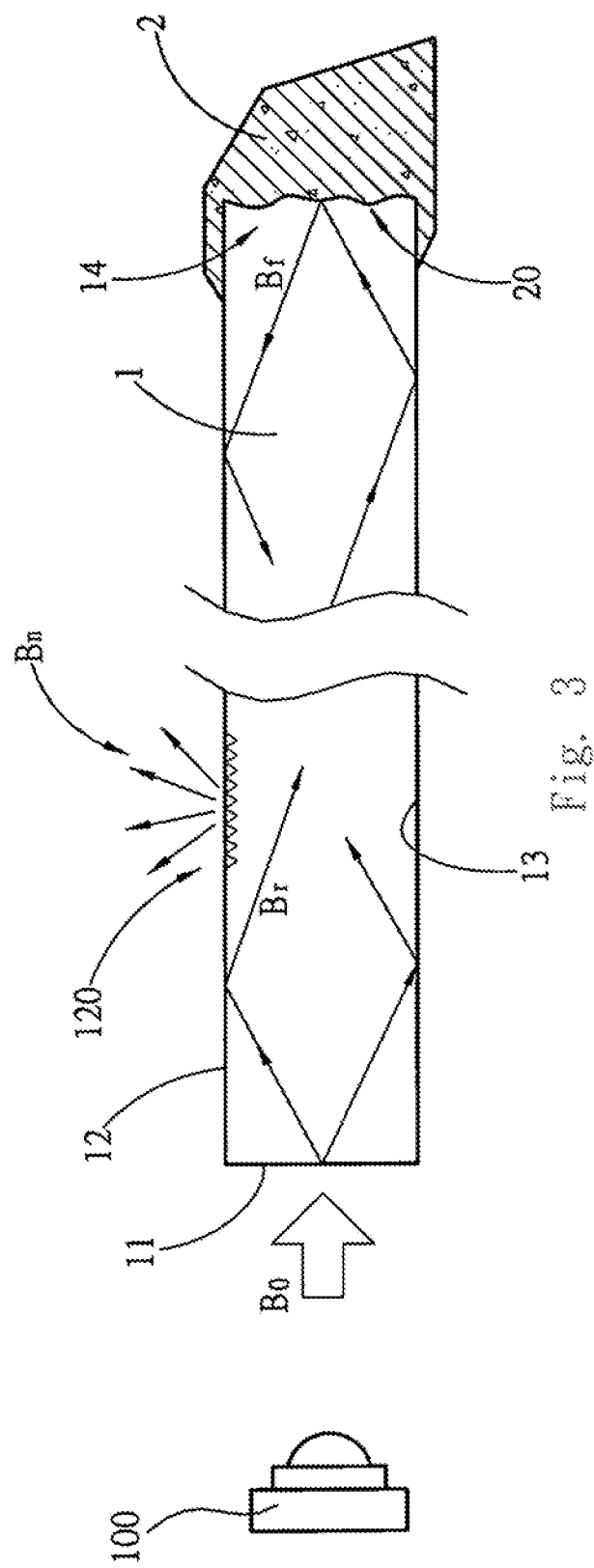
FIG. 3 is a cross-sectional drawing of vertical peripheral edges and a surrounding edge according to the present invention.

Please refer to FIG. 3 again. The light entering surface 11 of the light guide panel 1 controls the light beam $B_0$ in the reflecting surface 13 and the projecting surface 12 of the light guide panel 1, partial of light beam $B_0$ is refracted away at a releasing area 120 as the refracting beams $B_n$, and a reflecting beam $B_r$ moves forward and forms a small reflecting angle against the releasing area 120 and the reflecting surface 13, then reaches the vertical peripheral edges 14.

Figure 4:
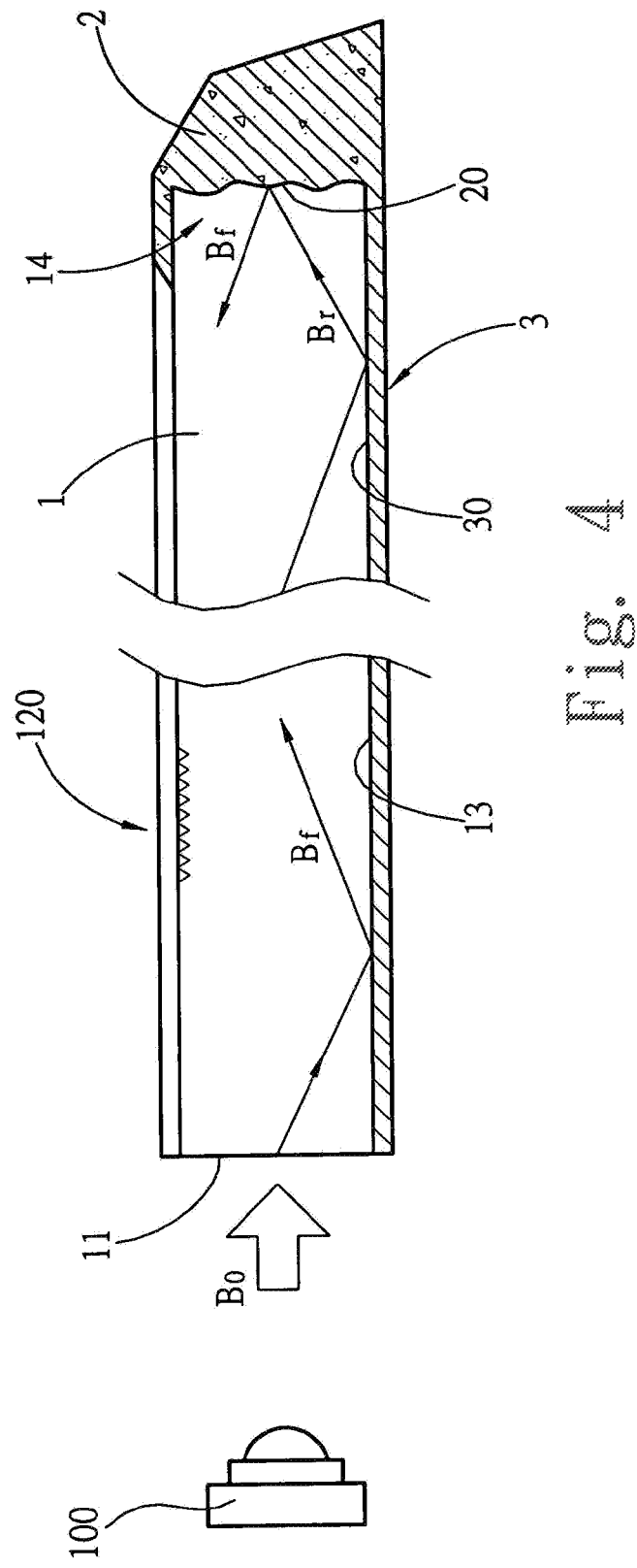
FIG. 4 is a cross-sectional drawing of the surrounding edge and the optical panel according to the present invention.

Please refer to FIG. 4. The connecting interface 20 formed between the surrounding edge 2 and the vertical peripheral edges 14 of the light guide panel 1 is used for blocking or transforming the reflecting beam $B_r$ as the feedback beam $B_f$.

The surrounding edge 2 further includes an optical panel 3 extending towards to the reflecting surface 13 of the light guide panel 1, and a connecting face 30 is formed between the optical panel 3 and the reflecting surface 13, and the connecting face 30 has similar characteristic as the connecting face 20. If the optical panel 3 is made of reflective material, the connecting face 30 increases the reflective rate of the reflecting beam Br, which reduce consuming power of the illuminating element 100.

The light guide panel 1 can be made of a plasticized material and has an upper surface and lower surfaces having both reflecting and refracting capabilities, and be sized down by the low cost cutting process. The vertical peripheral edges 14 has an uneven surface, the surrounding edge 2 is directly combined onto the surface of the vertical peripheral edges 14 with the connecting interface 20 in-between. The connecting interface 20 can fill up gap caused by the uneven surface of the vertical peripheral edges 14 and provide efficient shading effect to the vertical peripheral edges 14. Accordingly, the tight combination between the surrounding edge 2 and the vertical peripheral edges 14 makes the connecting interface 20 is able to increase the reflective rate of the vertical peripheral edges 14. In addition, if the surrounding edge 2 is made of reflective material, the connecting interface 20 can generates the feedback beam $B_f$ to enhance the illumination effect.

Therefore, the light transmission in the light guide panel 1 can be limited in the upper and lower surfaces without leakage at the vertical peripheral edges.

It is to be understand that while certain forms of the present invention have been illustrated and described herein, it is not to be limited to the specific forms or arrangement of parts described and shown.

What is claimed is:

1. An adjustable back-lighting structure for a keyboard comprising
    a light guide panel having vertical peripheral edges and at least one light entering surface; and
    a surrounding edge made of plastic or chemical macromolecule compound material, having a connecting interface tightly bonded with the vertical peripheral edges of the light guide panel, and having a predetermined thickness at least 0.2 mm;
    wherein the surrounding edge of the light guide panel further has an optical panel corresponding to a bottom face of the light guide panel, and a connecting surface of the optical panel is tightly combined with the bottom face of the light guide panel.

2. The adjustable back-lighting structure for a keyboard as claimed in claim 1, wherein the surrounding edge is made of a shading material or a reflective material.

3. The adjustable back-lighting structure for a keyboard as claimed in claim 1, wherein the surrounding edge is macromolecule compound liquid, such that the connecting interface is adhered onto the vertical peripheral edges.

4. The adjustable back-lighting structure for a keyboard as claimed in claim 1, wherein the surrounding edge is molded as one.

5. The adjustable back-lighting structure for a keyboard as claimed in claim 1, wherein the connecting face is capable of reflecting light.

6. The adjustable back-lighting structure for a keyboard as claimed in claim 1, wherein a forming method of the surrounding edge comprises: forming a groove around the vertical peripheral edges; placing a carrying board below the light guide panel and the groove, filling the liquid plastic or chemical macromolecule compound material into the groove to form the surrounding edge when harden.

* * * * *